(12) United States Patent
Noto

(10) Patent No.: US 7,758,259 B2
(45) Date of Patent: Jul. 20, 2010

(54) OPTICAL DEVICE

(75) Inventor: Goro Noto, Ohta-ku (JP)

(73) Assignee: Canon Kabushiki Kaisha, Tokyo (JP)

( * ) Notice: Subject to any disclaimer, the term of this patent is extended or adjusted under 35 U.S.C. 154(b) by 971 days.

(21) Appl. No.: 11/534,392

(22) Filed: Sep. 22, 2006

(65) Prior Publication Data

US 2007/0013804 A1 Jan. 18, 2007

Related U.S. Application Data

(63) Continuation-in-part of application No. 11/332,719, filed on Jan. 12, 2006, now abandoned.

(30) Foreign Application Priority Data

| Jan. 12, 2005 | (JP) | ............................. 2005-005539 |
| Dec. 13, 2005 | (JP) | ............................. 2005-359535 |

(51) Int. Cl.
*G03B 17/00* (2006.01)
(52) U.S. Cl. ..................... 396/439; 348/340; 359/507
(58) Field of Classification Search ............... 396/439, 396/25; 359/507; 348/340
See application file for complete search history.

(56) References Cited

U.S. PATENT DOCUMENTS

| 5,557,261 | A | * | 9/1996 | Barbour ...................... 340/580 |
| 6,055,376 | A | * | 4/2000 | Ohtaka et al. ................. 396/51 |
| 6,067,137 | A | * | 5/2000 | Ohnishi et al. ............... 349/112 |
| 6,075,235 | A | * | 6/2000 | Chun ...................... 250/208.1 |
| 7,220,371 | B2 | * | 5/2007 | Suganuma ................. 264/1.31 |
| 2004/0047625 | A1 | | 3/2004 | Ito et al. |
| 2008/0055459 | A1 | | 3/2008 | Ito et al. |
| 2008/0198457 | A1 | * | 8/2008 | Sakai et al. ................. 359/507 |

FOREIGN PATENT DOCUMENTS

| CN | 1462145 A | 12/2003 |
| CN | 1146675 C | 4/2004 |
| JP | 2000-29132 | 1/2000 |
| JP | 2001-183289 | 7/2001 |
| JP | 2003-5254 | 1/2003 |
| WO | 00/14296 | 3/2000 |

OTHER PUBLICATIONS

Chinese Office Action issued on Jul. 4, 2008, concerning the corresponding Chinese Patent Application No. 2006100009162 with English translation.
Israelachvili, Jacob N., *Intermolecular and Surface Forces*, Chapter 12, *Electrostatic Forces between Surfaces in Liquids*, pp. 161-193, Academic Press Inc., (London) Ltd., 1985.
"The Society of Powder Technology, Japan, Proceedings of Autumn Annual Meeting in 2004" with English translation.

* cited by examiner

*Primary Examiner*—Christopher Mahoney
(74) *Attorney, Agent, or Firm*—Canon U.S.A., Inc., IP Division

(57) ABSTRACT

In an optical device including an optical system to form an optical image of an object to be photographed, an image capture unit to convert the optical image of the object to be photographed into an electrical signal, and an optical device arranged on the front surface of the image capture unit, a water repellent layer or a structure with a three-dimensional pattern to reduce the adhesive force of an alien substance is provided on a surface of the optical element on the opposite side of the optical system.

2 Claims, 15 Drawing Sheets

FIG. 5

|   | WITH WATER REPELLENT LAYER | WITHOUT WATER REPELLENT LAYER |
|---|---|---|
|   | AVERAGE ADHESION FORCE | AVERAGE ADHESION FORCE |
| A | 893.76 | 1213.40 |
| B | 853.78 | 1287.61 |

F I G. 9
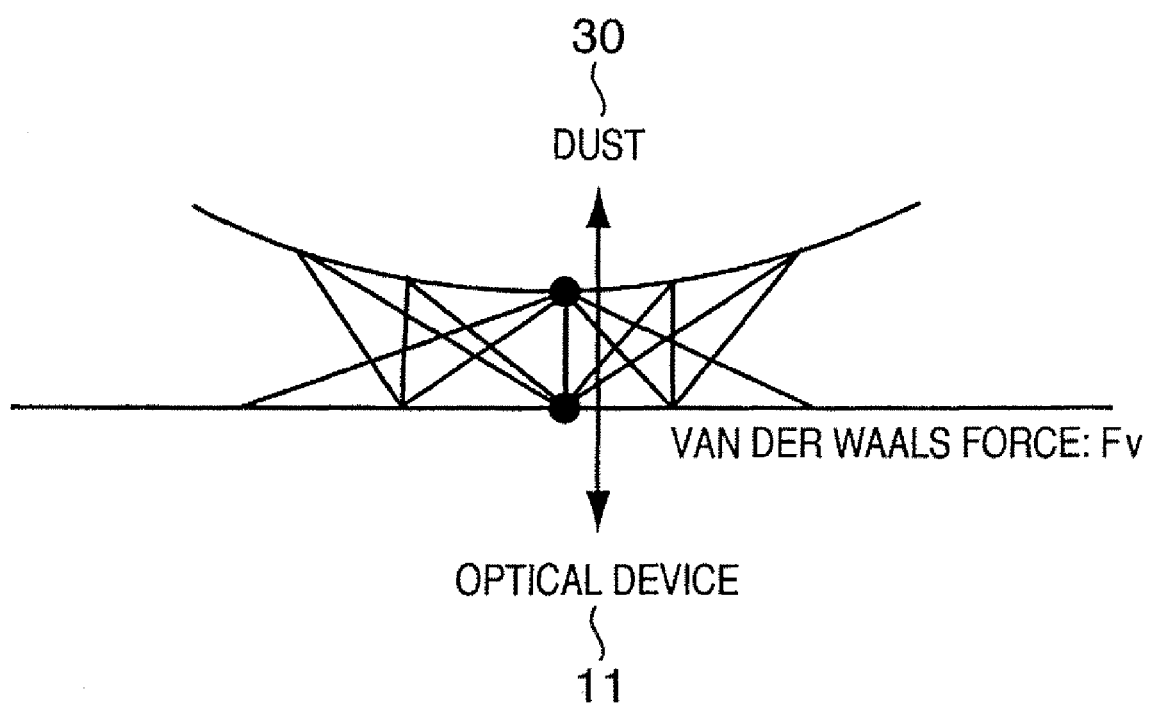

FIG. 11

| | AVERAGE ADHESION FORCE | ADHESION FORCE REDUCED RATIO |
|---|---|---|
| WITH THREE DIMENSIONAL STRUCTURE (DEPTH 80nm) | 81.25 | 42.1% |
| WITH THREE DIMENSIONAL STRUCTURE (DEPTH 250nm) | 36.51 | 18.9% |
| WITHOUT THREE DIMENSIONAL STRUCTURE | 192.99 | |

F I G. 13
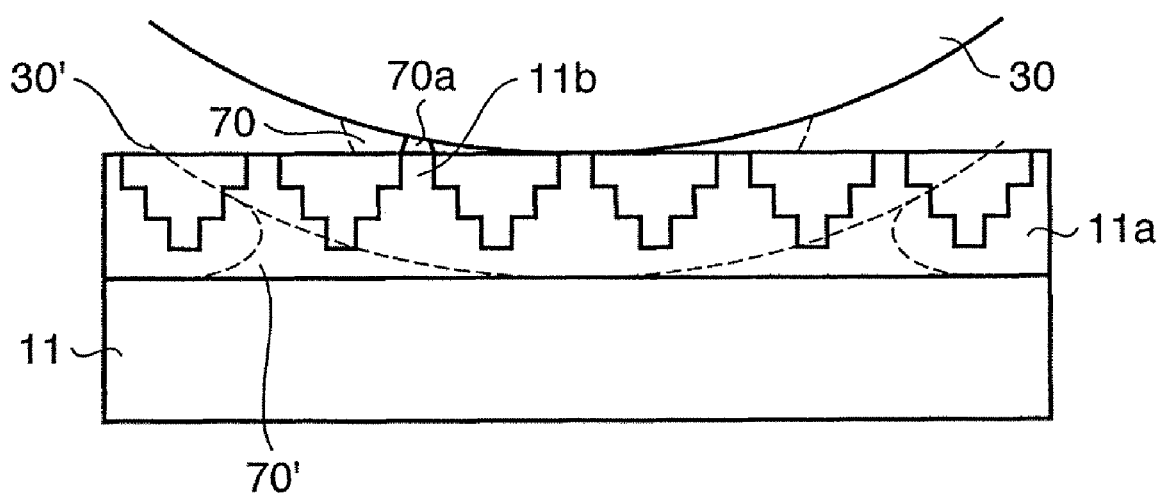

OPTICAL DEVICE

This is a continuation-in-part application of U.S. patent application Ser. No. 11/332,719 filed on Jan. 12, 2006, now abandoned entitled "OPTICAL DEVICE".

BACKGROUND OF THE INVENTION

1. Field of the Invention

The present invention relates to an optical device such as a digital camera and, more particularly, to a structure which suppresses an alien substance such as dust from adhering to the surface of an optical member disposed on or near the focal plane, e.g., a solid image sensing device, optical filter, or lens incorporated in an optical device.

2. Description of the Related Art

Conventionally, if an alien substance such as dust adheres to the vicinity of the focal plane of the photographing lens of a digital single-lens reflex camera of lens interchangeable type, the shadow of the alien substance is sensed by a solid image sensing device. Such an alien substance is supposed to be external dust which enters upon lens replacement, or fine abrasion powder of resin or the like of the structural component of the shutter or mirror, which is generated as the component operates in the camera. An alien substance generated due to these reasons enters especially between the protective cover glass of the solid image sensing device and an infrared cut filter or optical low-pass filter (to be abbreviated as an LPF hereinafter) arranged on the entire surface of the cover glass. To remove the alien substance, it is necessary to disassemble the camera. Hence, a sealed structure is very effective for preventing any alien substance from entering between the optical filter and the cover glass of the solid image sensing device.

However, if an alien substance adheres to the surface of the optical filter on the opposite side of the solid image sensing device, and its position is near the focal plane, the shadow of the alien substance is sensed by the solid image sensing device.

To solve this problem, the cover glass surface of the solid image sensing device is cleaned by a wiper (Japanese Patent Laid-Open No. 2003-005254 (FIGS. 1 and 9 on page 8)). With this structure, any alien substance adhering to the cover glass surface of the solid image sensing device or the outermost surface (e.g., the optical filter surface) of the dustproof structure can be removed without detaching the lens or disassembling the camera. In the arrangement disclosed in Japanese Patent Laid-Open No. 2003-005254, however, the cover glass surface of the solid image sensing device or the outermost surface of the dustproof structure is rubbed by the wiper. If the alien substance is hard, like metal powder, it can make scratches on the cover glass surface of the solid image sensing device or the outermost surface of the dustproof structure. In addition, the alien substance temporarily removed by the wiper floats in the camera and re-adheres to the cover glass surface of the solid image sensing device or the outermost surface of the dustproof structure.

As a solution to the former problem, a transparent electrode is formed on each of the cover glass surface of the solid image sensing device and the surface of the optical filter to suppress any alien substance from adhering to the cover glass surface of the solid image sensing device (Japanese Patent Laid-Open No. 2000-029132 (FIG. 2 on page 8)). According to the technique described in Japanese Patent Laid-Open No. 2000-029132, potentials are applied to the transparent electrodes provided on the cover glass surface of the solid image sensing device and the surface of the optical filter to neutralize static electricity generated on the cover glass surface of the solid image sensing device and the surface of the optical filter. This structure can suppress dust from adhering to the cover glass surface of the solid image sensing device and the surface of the optical filter due to static electricity. However, since the transparent electrodes are provided on the cover glass surface and the surface of the optical filter, the light transmittance to the image sensing device decreases, resulting in an adverse optical effect. In addition, since static electricity generated on the cover glass surface of the solid image sensing device and the surface of the optical filter changes depending on the environment (temperature and humidity) or use conditions, control to neutralize the static electricity is difficult. If the static electricity cannot be neutralized, the suppressing effect is insufficient.

As another technique, a fine periodic structure is formed on the surface of a silicon plate by a femtosecond ($10_{-15}$ sec) laser to weaken the adhesive force of fine particles in the atmosphere to the plate (The Society of Powder Technology, Japan, Proceedings of Autumn Annual Meeting in 2004 (FIGS. 1 and 2 on page 34 and FIG. 4 on page 35)). As is reported, the van der Waals force and crosslinking force of liquid, which act between glass beads and the silicon plate, is decreased by the fine periodic structure. However, this reference contains no mention of whether the fine periodic structure can be formed on the cover glass of an optical element or the surface of an optical filter by the femtosecond laser. The period of the fine periodic structure is about 620 nm, which falls within the visible light range. Since an adverse optical effect may occur, the technique of this report cannot directly be applied as a measure against an alien substance adhering to the cover glass surface of the solid image sensing device or the surface of the optical filter.

SUMMARY OF THE INVENTION

It is an object of the present invention to solve the problems of the above-described prior arts.

It is a characteristic feature of the present invention to provide an optical device which suppresses an alien substance from adhering to an optical element without any adverse optical effect.

The above-described characteristic feature is achieved by combining characteristic features described in independent claims. Dependent claims define more advantageous embodiments of the present invention.

According to the present invention, there is provided with an optical device having image capture unit for converting an optical image of an object to be photographed into an electrical signal and an optical element which is arranged on a front surface of the image capture unit, wherein a structure to reduce a crosslinking force of liquid on a surface of the optical element on a side of the object to be photographed is provided on the surface.

Further, according to the present invention, there is provided with an optical device having image capture unit for converting an optical image of an object to be photographed into an electrical signal and an optical element which is arranged on a front surface of the image capture unit, wherein a structure to reduce a van der Waals force on a surface of the optical element on a side of the object to be photographed is provided on the surface.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 5 depicts a table showing an example of the measurement result of the adhesive force of dust to a structure with or without a water repellent layer according to the first embodiment of the present invention;

FIG. 9 depicts a view for explaining the van der Waals force;

FIG. 11 shows an example of the adhesive force measurement result of dust, with and without the three-dimensional structure, according to the second embodiment;

FIG. 13 depicts an enlarged view of a portion where the dust 30 contacts the three-dimensional structure 11a according to the third embodiment of the present invention;

DESCRIPTION OF THE EMBODIMENTS

A preferred embodiment of the present invention will be hereinafter explained in detail with reference to the accompanying drawings. Note that the embodiment described below does not limit the claimed invention and all combinations of characteristics explained in the embodiment are not always essential for means for resolution of the invention.

First Embodiment

A digital single-lens reflex camera (to be abbreviated as a D-SLR hereinafter) of lens interchangeable type according to the first embodiment of the present invention will be described below with reference to FIGS. 1 to 5.

Figure 1:
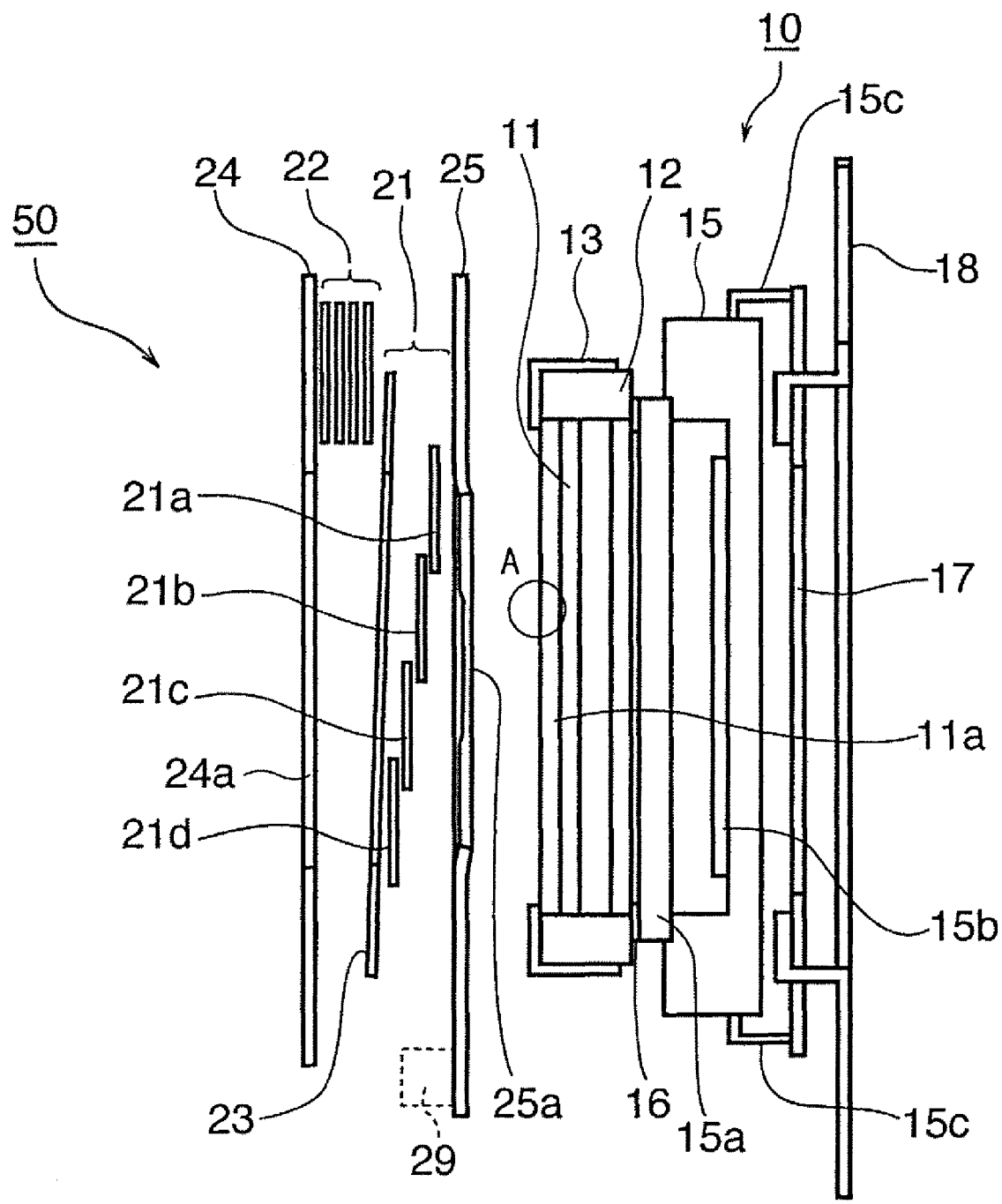
FIG. 1 depicts a side sectional view for explaining the schematic arrangement of the image capture unit and focal plane shutter of a D-SLR according to the first embodiment of the present invention.

FIG. 1 depicts a side sectional view for explaining the schematic arrangement of an image capture unit 10 and focal plane shutter 50 of a D-SLR 100 according to the first embodiment of the present invention.

Referring to FIG. 1, the image capture unit 10 has the following arrangement. The image capture unit 10 comprises an optical element 11 such as glass or a filter, a holder 12 which holds the optical element 11, a supporting plate 13 which integrates the optical element 11 and holder 12 while being in contact with the surface of the optical element 11, a solid image sensing unit 15 including a solid image sensing device 15b and a cover 15a to protect the solid image sensing device 15b, a seal 16 which seals between the optical element 11 and the cover 15a of the solid image sensing unit 15, a substrate 17 which connects to a connector 15c of the solid image sensing unit 15 and has an electrical device included in a control circuit (circuits and controller and the like in FIG. 3) to control the operation of the D-SLR 100, and a holding plate 18 which is integrated with the solid image sensing unit 15 to fix it by screws (not shown) to the chassis (not shown) of the D-SLR 100.

A water repellent layer 11a is provided on the surface of the optical element 11 on the opposite side of the focal plane shutter 50. The water repellent layer 11a is a fluorine-based thin film made of, e.g., Novec EGC-1720 available from 3M. The water repellent layer 11a is transparent and 5 to 10 nm thick. The water repellent layer 11a has a fluorine group exposed to the surface. The water repellent layer 11a is formed on the surface of the optical element 11 by a wet process such as dipping or a dry process such as deposition.

The focal plane shutter 50 will be described next. The focal plane shutter 50 comprises a front curtain 21 including a plurality of sectors 21a to 21d, a rear curtain 22 including a plurality of sectors, an intermediate plate 23 which divides the driving space of the front curtain 21 and rear curtain 22 in the focal plane shutter 50, a pressure plate 24 serving as the pressure plate of the rear curtain 22 and having, almost at the center, an aperture 24a for image sensing, and a cover plate 25 serving as the pressure plate of the front curtain 21 and having, almost at the center, an aperture 25a for image sensing. A stopper rubber 29 has a stopper portion to position the sectors 21a to 21d of the front curtain 21 in an open state.

Figure 2:
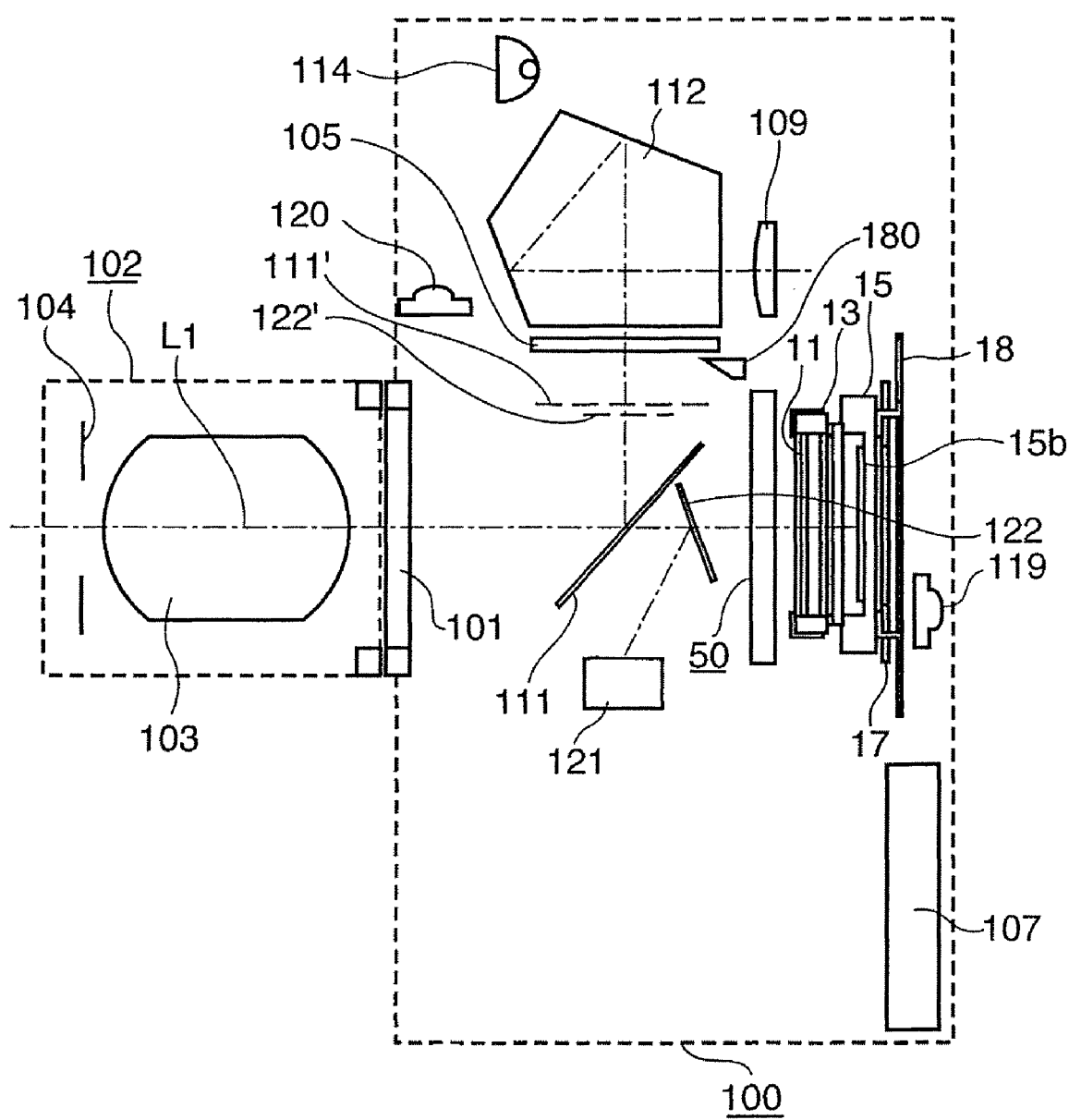
FIG. 2 depicts a schematic view showing the arrangement of the camera system of the D-SLR according to the first embodiment.

FIG. 2 depicts a schematic view showing the arrangement of the camera system of the D-SLR 100 according to the first embodiment. The same reference numerals as in FIG. 1 denote the same parts in FIG. 2, and a description thereof will be omitted. This camera system has a camera body (image sensing unit) and a lens unit detachably mounted on the camera body.

The D-SLR 100 according to the first embodiment is a single-CCD digital color camera using an image sensing device such as a CCD or CMOS sensor. The D-SLR 100 obtains an image signal representing a moving image or still image by driving the solid image sensing device 15b continuously or only once. The solid image sensing device 15b is an area sensor which accumulates charges corresponding to the light-receiving amount by converting exposure light into an electrical signal for each pixel and reads out the accumulated charges.

Referring to FIG. 2, a lens mount 101 connects a detachable lens unit 102 to the D-SLR 100. The lens unit 102 is electrically and mechanically connected to the D-SLR 100 through the lens mount 101. When the lens unit 102 with a different focal length is attached to the D-SLR 100, images with various view angles can be obtained. The optical element 11 is provided in an optical path L1 from a photographing optical system 103 of the lens unit 102 to the solid image sensing unit 15 to limit the cutoff frequency of the photographing optical system 103 so that an unnecessarily high spatial frequency component of an object image (optical image) is not transmitted to the solid image sensing unit 15.

The signal read out from the solid image sensing unit 15 is subjected to predetermined processing, as will be described later, and displayed on a display 107 as image data. Since the display 107 is attached to the rear surface of the D-SLR 100, the user can directly observe display on the display 107. When the display 107 is formed from an organic EL space modulation device, liquid crystal space modulation device, or space modulation device using the electrophoresis of fine particles, the electric power consumption can be reduced, and the display 107 can be made thin. Hence, electric power saving and size reduction of the D-SLR 100 can be implemented.

Specifically, the solid image sensing unit 15 is a CMOS compatible sensor (to be abbreviated as a CMOS sensor hereinafter), i.e., one of amplification solid image sensing devices. When the CMOS sensor is employed, the MOS transistors of the area sensor and peripheral circuits such as an image capture driving circuit, A/D converter, and image processing circuit can be formed in the same process. Hence, the number of masks and the number of processing steps can greatly be reduced as compared to a CCD. Additionally, since random access to an arbitrary pixel is possible, thinned-out read can be done for image display. Hence, data can be displayed on the display 107 in real time at a high display rate. Using the above-described advantages, the solid image sensing unit 15 executes a display image output operation (read in a region obtained by partially thinning out the light-receiving region of the solid image sensing unit 15) and a high-resolution image output operation (read in the entire light-receiving region).

A movable half mirror 111 reflects some components of the light beam from the photographing optical system 103 and passes the remaining components. The half mirror 111 has a refractive index of about 1.5 and a thickness of 0.5 mm. A focusing screen 105 is arranged on the prospective imaging plane of the object image formed by the photographing optical system. Reference numeral 112 denotes a pentaprism. A finder lens 109 is used to observe the object image formed on the focusing screen 105 and includes one or a plurality of finder lenses (not shown). The focusing screen 105, pentaprism 112, and finder lens 109 construct a finder optical system.

A movable submirror 122 is provided behind (image surface side) the half mirror 111 to reflect some of the light components passing through the half mirror 111, which are close to the light axis L1, and guides the light components to a focus detector 121. The submirror 122 rotates about a rotating shaft provided in the holding member (not shown) of the half mirror 111 and moves interlockingly with the movement of the half mirror 111. The focus detector 121 receives the light beam from the submirror 122 and detects the focus by phase difference detection.

The optical path division system including the half mirror 111 and pentaprism 112 can take a first optical path division state to guide light to the finder optical system and a second optical path division state (positions 111' and 122' indicated by broken lines in FIG. 2) wherein the mirrors are retracted from the photographing optical path to directly guide the light beam from the imaging lens (not shown) to the solid image sensing unit 15. A movable electronic flash 114 can move between a storage position where the electronic flash 114 is stored in the D-SLR 100 and a light-emitting position where the electronic flash 114 projects from the D-SLR 100. The focal plane shutter 50 adjusts the amount of light incident on the image surface. A main switch 119 activates the D-SLR 100. A release button 120 with two strokes starts a prephotographing operation (photometry and focusing) when being pressed halfway (SW1 is ON) and a photographing operation (recording image data read out from the solid image sensing unit 15 in a recording medium) when being fully pressed (SW2 is ON). An information display unit 180 in optical finder displays specific information on the focusing screen 105. Reference numeral 104 denotes an iris diaphragm.

Figure 3:
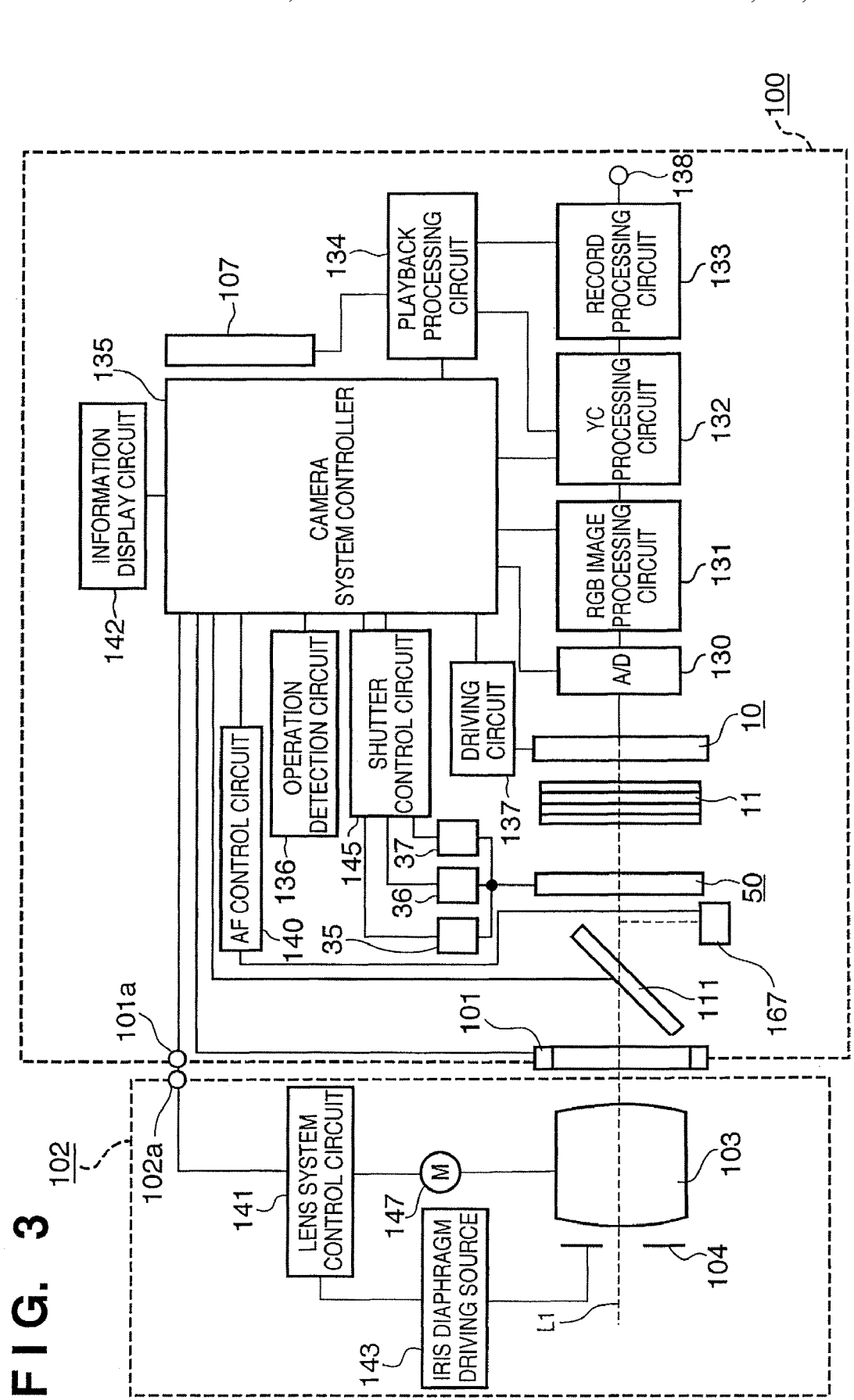
FIG. 3 is a block diagram for explaining the electrical arrangement of the camera system of the D-SLR according to the first embodiment.

FIG. 3 is a block diagram for explaining the electrical arrangement of the camera system of the D-SLR according to the first embodiment. The same reference numerals as in FIGS. 1 and 2 described above denote the same parts in FIG. 3.

The camera system has an image capture system, image processing system, recording/playing back system, and control system. The image capture system has the image capture unit 10 including the photographing optical system 103 and solid image sensing unit 15 (FIG. 1). The image processing system has an A/D converter 130, RGB image processing circuit 131, and YC processing circuit 132. The recording/playing back system has a record processing circuit 133 and playback processing circuit 134. The control system has a camera system controller 135, operation detection circuit 136, and image capture driving circuit 137. A connector 138 is a standardized terminal to be connected to an external computer to transmit/receive data. The above-described circuits are driven upon receiving electric power from a small-sized fuel cell (not shown).

The image capture system serves as an optical processing section which forms an image of light from an object on the imaging surface of the solid image sensing unit 15 through the photographing optical system 103. When driving of the iris diaphragm 104 provided in the photographing optical system 103 is controlled, and the focal plane shutter 50 is driven through a shutter control circuit 145 as needed, the solid image sensing unit 15 can receive light in an appropriate amount. The solid image sensing unit 15 according to the first embodiment uses the image sensing device 15b which has a total of about 10,000,000 square pixels including 3,700 pixels arrayed in the long side direction and 2,800 pixels arrayed in the short side direction. A so-called Bayer array is formed, in which R (red), G (green), and B (blue) color filters are alternately arranged on the pixels, and four pixels form one set. In the Bayer array, G pixels which are strongly perceived by an observer who sees the image are arranged in a larger number than the R or B pixels, thereby increasing the total image performance. Generally, in image processing using an image sensing device of this scheme, a luminance signal is mainly generated from G, and chrominance signals are generated from R, G, and B.

A signal read out from the solid image sensing unit 15 is supplied to the above-described image processing system through the A/D converter 130. Image data is generated by image processing in the image processing system. The A/D converter 130 converts the output signal from the image sensing device 15b into, e.g., a 10-bit digital signal in accordance with the amplitude of the signal read out from each pixel of the image sensing device 15b. Image processing after A/D conversion is executed by digital processing. The image processing system includes a signal processing circuit to obtain an image signal of a desired format from R, G, and B digital signals so that the R, G, and B chrominance signals are converted into, e.g., YC signals expressed by a luminance signal Y and color difference signals (R-Y) and (B-Y). The RGB image processing circuit 131 processes the output signal from the A/D converter 130 and includes a white balance circuit, gamma correction circuit, and interpolation operation circuit which increases the resolution by interpolation operation. The YC processing circuit 132 generates the luminance signal Y and color difference signals R-Y and B-Y. The YC processing circuit 132 has a high-luminance signal generation circuit to generate a high-luminance signal YH, a low-luminance signal generation circuit to generate a low-luminance signal YL, and a color difference signal generation circuit to generate the color difference signals R-Y and B-Y. The luminance signal Y is formed by combining the high-luminance signal YH and low-luminance signal YL.

The recording/playing back system is a processing system which outputs an image signal to a memory (e.g., memory card) (not shown) and outputs an image signal to the display 107. The record processing circuit 133 writes/reads an image signal in/from the memory. The playback processing circuit 134 plays back the image signal read out from the memory and outputs the signal to the display 107. The record processing circuit 133 also incorporates a compression/expansion circuit to compress YC signals representing still image data or moving image data by a predetermined compression scheme and expand the compressed data. The compression/expansion circuit has a frame memory for signal processing. YC signals from the image processing system are stored in the frame memory for each frame. The stored signal is read out from each of the plurality of blocks and compression-coded. Compression-coding is done by, e.g., executing two-dimensional discrete transform, normalization, and Huffman encoding for the image signal of each block. The playback processing circuit 134 matrix-converts the luminance signal Y and color difference signals R-Y and B-Y into, e.g., R, G, and B signals. The signal converted by the playback processing circuit 134 is output to the display 107 and displayed (played back) as a visible image. The playback processing circuit 134 and display 107 may be connected by wireless communication such as Bluetooth. With this wireless connection, an image sensed by the camera can be monitored in a remote place.

The operation detection circuit 136 in the control system detects the operation of the main switch 119, release button 120, or the like (the remaining switches are not shown) shown in FIG. 2 and outputs the detection result to the camera system controller 135. Upon receiving the detection signal from the operation detection circuit 136, the front curtain driving source 35 executes an operation corresponding to the detection result. The camera system controller 135 also generates a timing signal for image sensing and outputs it to the image capture driving circuit 137. Upon receiving the control signal from the camera system controller 135, the image capture driving circuit 137 generates a driving signal to drive the solid image sensing unit 15. An information display circuit 142 controls driving of the information display unit 180 in optical finder (FIG. 2) upon receiving the control signal from the camera system controller 135.

The control system controls driving in the image capture system, image processing system, and recording/playing back system in accordance with the operations of various kinds of switches provided on the D-SLR 100. For example, when the SW2 is turned on by operating the release button 120, the control system (camera system controller 135) controls driving of the solid image sensing unit 15, operation of the RGB image processing circuit 131, or compression processing of the record processing circuit 133. The control system also changes display (state of a display segment) in the optical finder by controlling driving of the information display unit 180 in optical finder through the information display circuit 142.

The focusing operation of the photographing optical system 103 will be described next.

The camera system controller 135 is connected to an AF control circuit 140. When the lens unit 102 is attached to the D-SLR 100 through the lens mount 101, the camera system controller 135 is connected to a lens system control circuit 141 in the lens unit 102 through mount contacts 101a and 102a. The AF control circuit 140, lens system control circuit 141, and camera system controller 135 mutually communicate data necessary for specific processing.

The focus detector 121 (focus detection sensor 167) outputs, to the AF control circuit 140, a detection signal in a focus detection region provided at a predetermined position in the photographing screen. The AF control circuit 140 generates a focus detection signal on the basis of the output signal from the focus detector 121 (FIG. 2) and detects the focusing state (defocus amount) of the photographing optical system 103. The AF control circuit 140 converts the detected defocus amount into the driving amount of a focus lens as an element of the photographing optical system 103. Information about the converted focus lens driving amount is transmitted to the lens system control circuit 141 through the camera system controller 135. If focusing is to be done for a moving object, the AF control circuit 140 predicts an appropriate stop position of the focus lens in consideration of time lag from the time when the release button 120 is fully pressed to the time when actual image sensing control starts. Then, information about the focus lens driving amount to the predicted stop position is transmitted to the lens system control circuit 141.

If the camera system controller 135 determines on the basis of the signal from the solid image sensing device 15b that the luminance of the object to be photographed is so low that no sufficient focus detection accuracy is obtained, the object is illuminated by driving the electronic flash 114 or a white LED or fluorescent tube (not shown) provided on the D-SLR 100. Upon receiving information about the focus lens driving amount from the camera system controller 135, the lens system control circuit 141 moves the focus lens in the direction of light axis L1 by a distance corresponding to the driving amount through a driving mechanism (not shown) by controlling driving of an AF motor 147 arranged in the lens unit 102. With this operation, the photographing optical system 103 is set in an in-focus state. When the focus lens is formed from a liquid lens, as described above, the interface shape is changed. Upon receiving information about the exposure value (f-number) from the camera system controller 135, the lens system control circuit 141 operates the iris diaphragm 104 to obtain an iris aperture diameter corresponding to the f-number by controlling driving an iris diaphragm driving source (actuator) 143 in the lens unit 102.

The shutter control circuit 145 controls a front curtain driving source 35 which includes a driving lever and an electromagnetic actuator formed from a known coil and yoke, a charge source 36 which includes a driving lever and spring to execute closing operation to set the opened front curtain 21 again in a closed state shown in FIG. 1, and a rear curtain driving source 37 which includes a driving lever and an electromagnetic actuator formed from a known coil and yoke to open/close the rear curtain 22. Upon receiving information about the shutter speed from the camera system controller 135, the shutter control circuit 145 operates the front curtain 21 and rear curtain 22 to obtain the shutter speed by controlling driving of the front curtain driving source 35, rear curtain driving source 37, and charge source 36 serving as the driving source of the front curtain 21 and rear curtain 22 of the focal plane shutter 50. By the operations of the focal plane shutter 50 and iris diaphragm 104, object light in an appropriate amount can be sent to the image surface side. When the AF control circuit 140 detects the in-focus state of the object to be photographed, the information is transmitted to the camera system controller 135. When the SW2 is turned on by fully pressing the release button 120, the photographing operation is executed by the image capture system, image processing system, and recording/playing back system, as described above.

The effect of the water repellent layer 11a provided on the surface of the optical element 11 according to the first embodiment will be described next with reference to FIG. 4.

Figure 4:
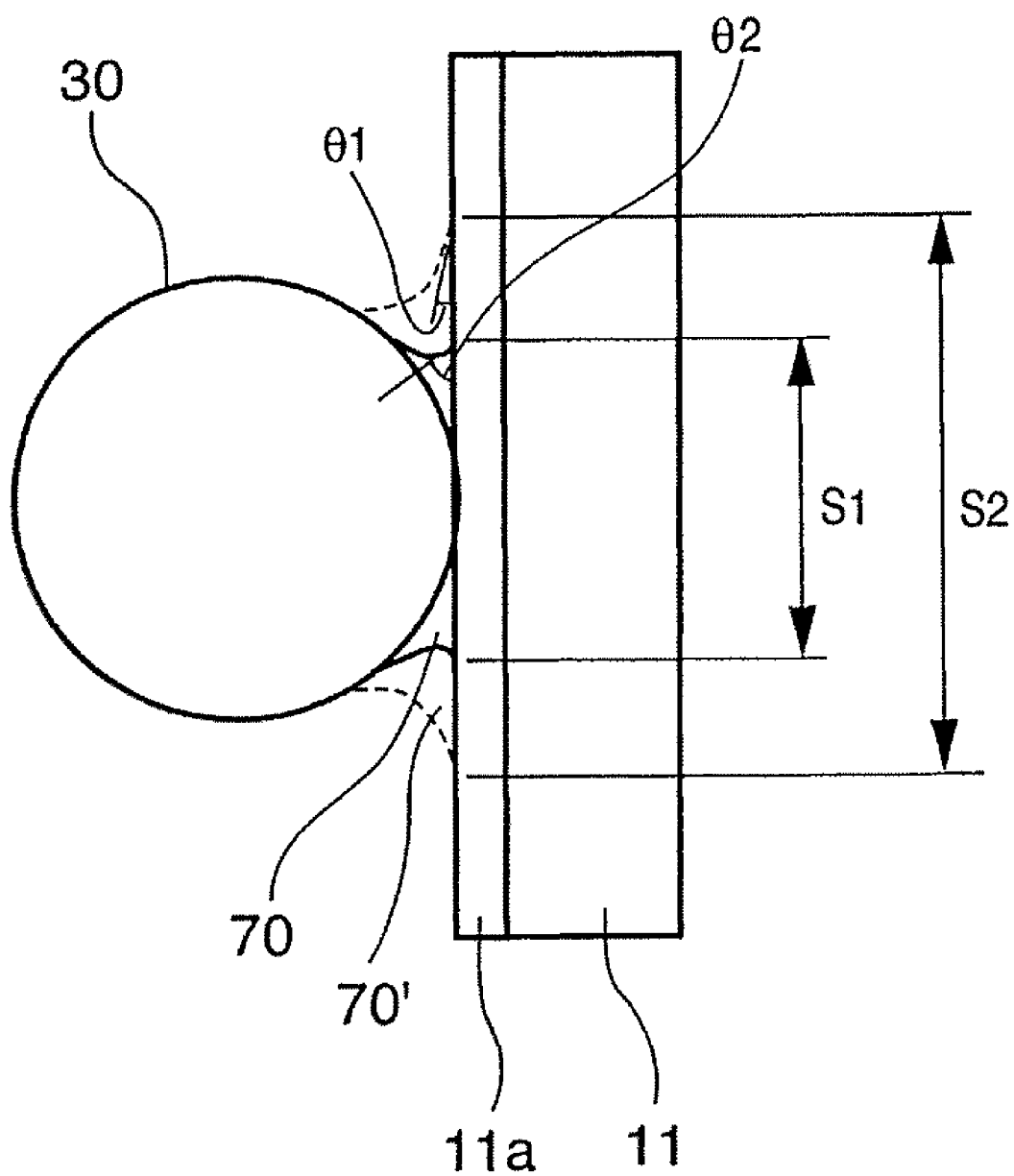
FIG. 4 depicts an enlarged view of a portion A in FIG. 1.

FIG. 4 depicts an enlarged view of a portion A in FIG. 1. Dust 30 adheres to the surface of the optical element 11.

As will be described later, a liquid crosslinking is formed between the dust 30 and the surface of the optical element 11. A liquid crosslinking formed when the water repellent layer 11a is provided on the surface of the optical element 11, as in the first embodiment, is indicated by a solid line 70 in FIG. 4. A liquid crosslinking formed when no water repellent layer 11a is provided on the surface of the optical element 11 is indicated by a broken line 70' in FIG. 4.

When the dust 30 adheres to the surface of the optical element 11, water molecules (not shown) contained in air cohere between the dust 30 and the surface of the optical element 11 to form the liquid crosslinking 70. Due to the liquid crosslinking 70, a crosslinking force of liquid, i.e., an adhesive force FL given by $$FL = 2\pi\sigma D \cos\theta (N) \quad (1)$$

acts between the dust 30 and the surface of the optical element 11.

In equation (1), $\sigma$ is the surface tension (N/m) of water, D is the diameter (m) of the dust 30, and $\theta$ is the contact angle (DEG) of water with respect to the surface of the optical element 11.

The crosslinking force of liquid for the same dust 30 will be examined. The surface tension (surface energy) of water does not change. Hence, the contact angle $\theta$ changes between the structure with the water repellent layer 11a on the surface of the optical element 11 and the structure without the water repellent layer 11a. The contact angle is represented by $\theta 1$ (without the water repellent layer 11a) or $\theta 2$ (with the water repellent layer 11a) ($\theta < \theta 2$; FIG. 4).

The contact angle corresponds to the surface energy ratio of water to the water repellent layer 11a (or the surface of the optical element 11). The surface energy of the water repellent layer 11a is compared with that of the optical element 11 without the water repellent layer 11a. When the water repellent layer 11a exists, the surface energy of the water repellent layer 11a is smaller because of the fluorine group exposed to the surface of the water repellent layer 11a. Hence, the contact angle changes depending on the presence/absence of the water repellent layer 11a. Since the contact angle is large when the surface energy is small, $\theta 1 < \theta 2$. The size of the liquid crosslinking 70 formed between the dust 30 and the surface of the water repellent layer 11a is compared with that of the liquid crosslinking 70' formed between the dust 30 and the surface of the optical element 11 (without the water repellent layer 11a). The liquid crosslinking 70 when the water repellent layer 11a is present (S1 in FIG. 4) is smaller than the liquid crosslinking 70' when the water repellent layer 11a is absent (S2 in FIG. 4) (S1<S2).

In equation (1), only the contact angle $\theta$ changes depending on the presence/absence of the water repellent layer 11a. Hence, when the contact angle $\theta$ increases, the adhesive force FL decreases ($0° \leq \theta \leq 90°$). That is, an adhesive force FL1 when the water repellent layer 11a is present and an adhesive force FL2 when the water repellent layer 11a is absent have a relationship FL1<FL2.

That is, the adhesive force of the dust 30 to the water repellent layer 11a (optical element 11) is reduced by the water repellent layer 11a. If the water repellent layer 11a exists, the dust 30 which is going to adhere to the optical element 11 drops from its surface because of the small adhesive force and the influence of gravity applied to the dust 30. Hence, the dust 30 hardly adheres to the surface of the optical element 11.

An actual measurement result of the adhesive force of the dust 30 to the optical element 11 with or without the water repellent layer 11a will be described with reference to FIG. 5.

FIG. 5 depicts a table showing an example of the measurement result of the adhesive force of dust to a structure with or without the water repellent layer 11a according to the first embodiment of the present invention.

In the example, adhesive force is measured using the inter-microparticle adhesive force (van der Waals force) measurement device "CONTACTOLE PAF-300N" from Okada Seiko Co., LTD. (see the detail of the measurement of JPA 2001-183289).

In the first embodiment, polystyrene particles with an average diameter of 50 μm were used as the dust 30. Measurement was done by using two types (A and B) as the water repellent layer 11a with a fluorine group on the surface.

As shown in FIG. 5, it was confirmed that the adhesive force of the dust 30 was decreased by about 30% by the water repellent layer 11a independently of its type.

As described above, according to the first embodiment, an optical device capable of suppressing dust from adhering to the surface of an optical element without any adverse effect on the optical system of the optical device can be implemented.

In the first embodiment, the water repellent layer 11a having the fluorine group on the surface has been exemplified. However, the present invention is not limited to this, and any other thin film having an effect of decreasing the surface energy of the optical element can be used.

Second Embodiment

A camera system according to the second embodiment of the present invention will be described next with reference to FIGS. 6 to 9. The same reference numerals as in the above-described first embodiment denote the same parts in the second embodiment, and a description thereof will be omitted.

Figure 6:
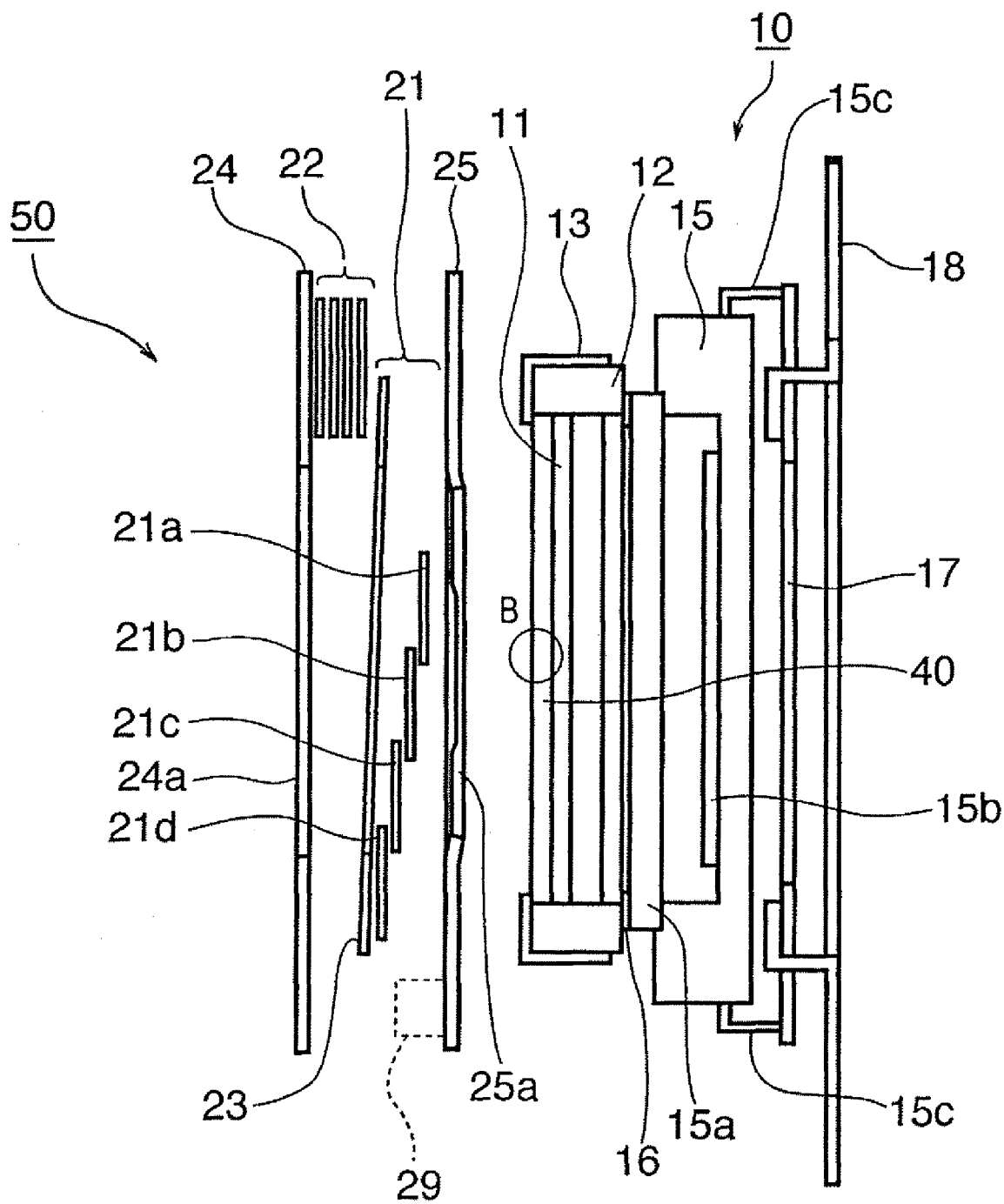
FIG. 6 depicts a side sectional view for explaining the schematic arrangement of the image capture unit and focal plane shutter of a D-SLR according to the second embodiment of the present invention.
Figure 7:
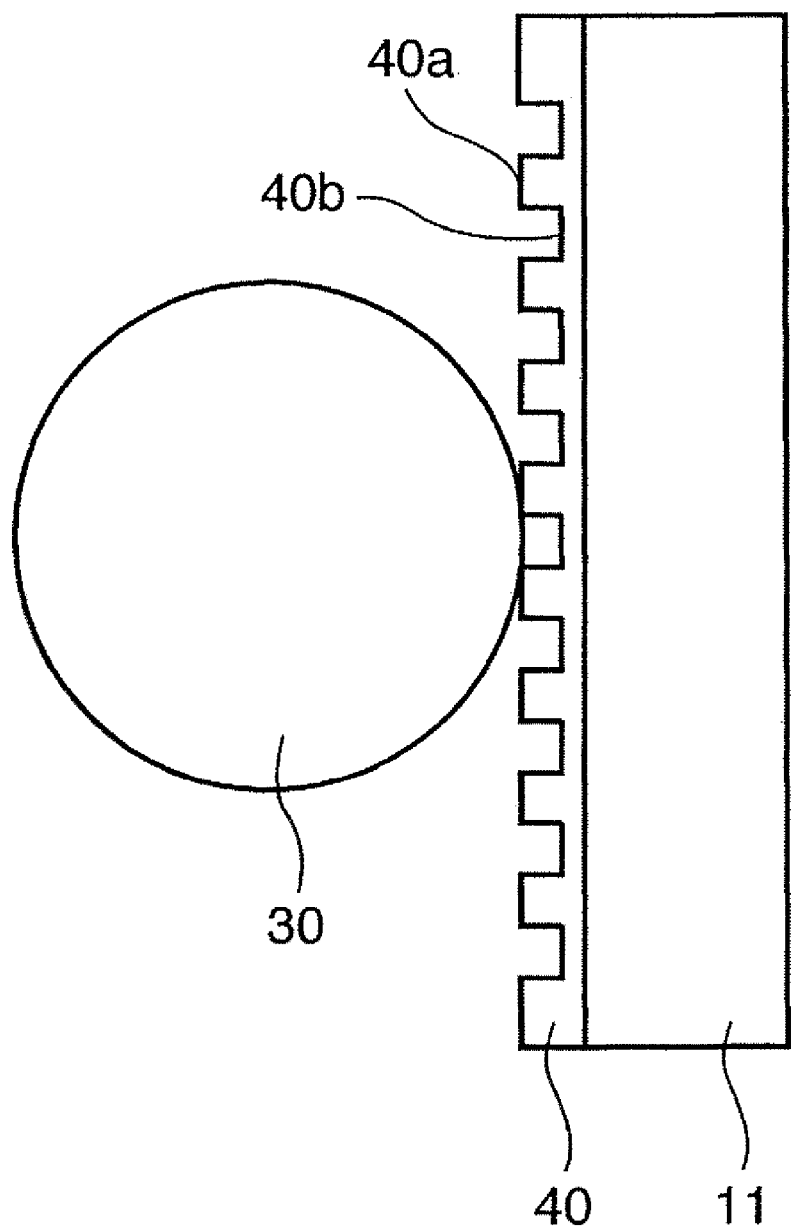
FIG. 7 depicts an enlarged view of a portion B in FIG. 6.

FIG. 6 depicts a side sectional view for explaining the schematic arrangement of an image capture unit 10 and focal plane shutter 50 of a D-SLR 100 according to the second embodiment of the present invention. FIG. 7 depicts an enlarged view of a portion B in FIG. 6. Dust 30 adheres to the surface of an optical element 11. The basic arrangement of the camera system 100 according to the second embodiment is the same as the camera system 100 (FIGS. 2 and 3) according to the above-described first embodiment, and a description thereof will be omitted.

The arrangement shown in FIG. 6 is basically the same as that shown in FIG. 1 of the above-described first embodiment except the surface of the optical element 11 indicated by B.

Referring to FIG. 7, reference numeral 40 denotes a three-dimensional structure 40 in which convex portions 40a and concave portions 40b are provided on the surface of the optical element 11 at a predetermined depth (level difference between the convex portions 40a and the concave portions 40b) and a predetermined pitch. To prevent any optical adverse effect of the three-dimensional structure 40, the depth and pitch of the convex portions 40a and concave portions 40b are preferably smaller (shorter) than at least the wavelength range (380 to 770 nm) of visible light.

Figure 8:
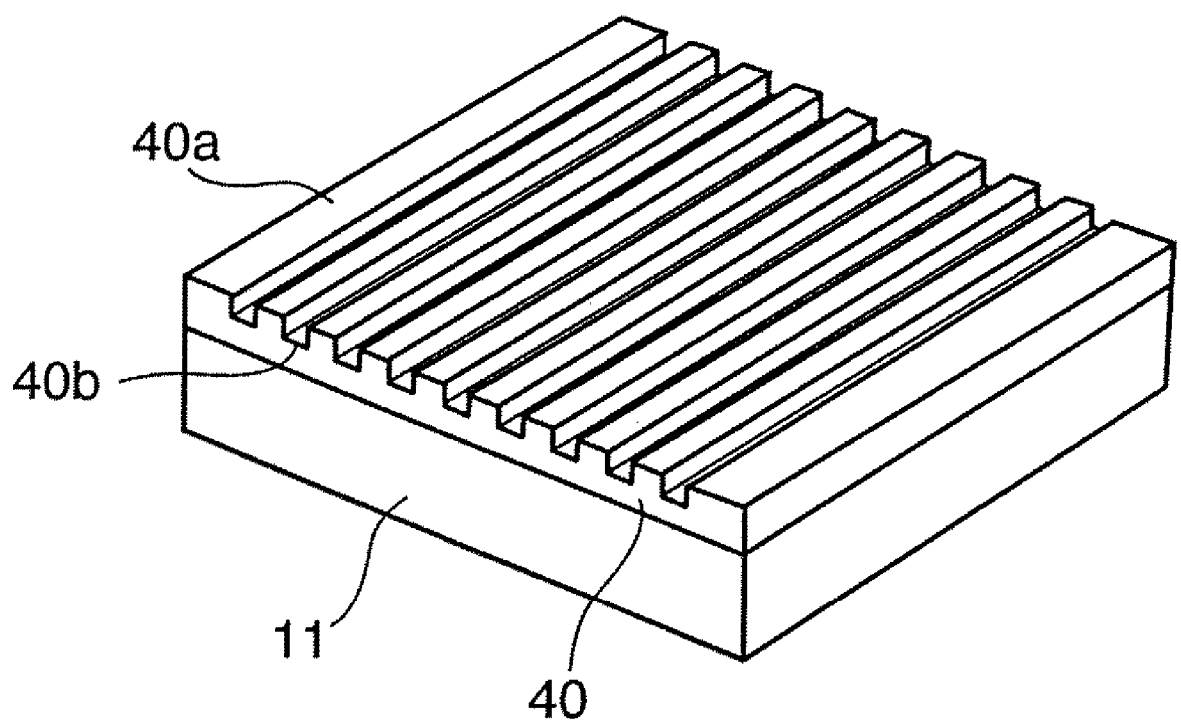
FIG. 8 depicts a schematic perspective view showing a three-dimensional structure according to the second embodiment of the present invention.

FIG. 8 depicts a schematic perspective view showing the three-dimensional structure 40.

As shown in FIG. 8, the convex portions 40a are formed in lines on the surface of the optical element 11. The three-dimensional structure 40 is formed by, e.g., a nanoimprint method in which a layer made of an acrylic or polycarbonate resin or fluorine-contained polymer resin on the surface of the optical element 11 is pressed against a mold (stamper) with a fine shape on the nano order, thereby transferring the fine shape of the mold to the resin layer. Hence, the three-dimensional structure can be formed independently of the material of the optical element 11.

When the dust 30 adheres to the surface of the optical element 11, a van der Waals force serving as an interaction force acts between the dust 30 and the surface of the optical element 11. The van der Waals force corresponds to an adhesive force Fv given by $$Fv = (HD/12Z^2)(N) \quad (2)$$

In equation (2), H is the Hamaker constant (J) of the dust 30, D is the diameter (m) of the dust 30, and Z is the separation distance between the dust 30 and the surface of the three-dimensional structure 40 (or optical element 11), which is 0.4 nm.

The van der Waals force for the same dust 30 will be examined. The diameter D and Hamaker constant H of the dust 30 do not change. Hence, the separation distance Z changes between the structure with the three-dimensional structure 40 on the surface of the optical element 11 and the structure without the three-dimensional structure 40.

The van der Waals force will be explained next with reference to FIG. 9.

FIG. 9 depicts a view for explaining the van der Waals force.

The van der Waals force is an interaction force acting between two objects. The van der Waals force is obtained by adding (integrating) the energy between all atoms in one object and that between all atoms of another object (reference: J. N. Israelachivili, "Intermolecular Force and Surface Force", page 172, Asakura Publishing) Hence, the van der Waals force acting between the dust 30 and the optical element 11 can be obtained in the same way, as shown in FIG. 9.

When the three-dimensional structure 40 is provided on the surface of the optical element 11, the separation distance between the dust 30 and the concave portion 40b is larger than that between the dust 30 and the convex portion 40a. Let Z1 be the separation distance to the convex portion 40a, and Z2 be the separation distance to the concave portion 40b in equation (2). Then, a van der Waals force Fv' acting between the three-dimensional structure 40 and the dust 30 is given by $$Fv' = (HD/12Z1^2 + HD/12Z2^2)(N) \quad (3)$$

The second term $(HD/12Z2^2)$ (van der Waals force acting on the concave portion 40b) of equation (3) is smaller than the first term because the separation distance Z2 is larger than the separation distance Z1. The separation distance Z between the dust 30 and the surface of the optical element 11 without the three-dimensional structure 40 is given by $$Z = Z1 \quad (4)$$

The surface area of the convex portions 40a is compared with that of the optical element 11 without the three-dimensional structure 40. The surface area of the convex portions 40a is smaller. Hence, the first term of equation (3) is smaller than the van der Waals force acting on the optical element 11 without the three-dimensional structure 40, which is obtained by equation (2). That is, an adhesive force Fv1 given by equation (3) when the three-dimensional structure 40 is present and an adhesive force Fv2 when the three-dimensional structure 40 is absent have a relationship given by $$Fv1 < Fv2$$

According to the arrangement of the second embodiment, the adhesive force of the dust 30 to the three-dimensional structure 40 (optical element 11) is reduced by the three-dimensional structure 40. The dust 30 which is going to adhere to the optical element 11 with the three-dimensional structure 40 drops from the surface of the optical element 11 because of the reduced adhesive force and the influence of gravity applied to the dust 30. Hence, the dust 30 hardly adheres to the surface of the optical element 11.

As described above, according to the second embodiment, an optical device capable of suppressing dust from adhering to the surface of an optical element without any adverse optical effect can be implemented.

In the second embodiment, as shown in FIG. 8, the convex portions 40a of the three-dimensional structure 40 are formed in lines. However, the present invention is not limited to this, and the convex portions 40a may be formed in, e.g., dots. When the dot shape is employed, the surface area of the convex portions 40a further decreases so that the van der Waals force can further be reduced. Hence the same effect as described in the second embodiment can be obtained.

In the second embodiment, the van der Waals force is reduced by the three-dimensional structure 40. However, the crosslinking force of liquid is also decreased by the fine periodic structure on the surface. Since the crosslinking force of liquid is also reduced by the three-dimensional structure 40 as well as the van der Waals force, adhesion of dust to the surface of the optical element 11 can further be suppressed.

FIG. 11 shows an example of the adhesive force measurement result of dust, with and without the three-dimensional structure 40, according to the second embodiment. As in the first embodiment, adhesive force is measured using the inter-microparticle adhesive force (van der Waals force) measurement device "PAF-300N" from Okada Seiko Co., LTD.

Further, polystyrene particles with the average diameter of 50 μm are used as a dust 30. As for three-dimensional structure 40, two types with groove (indentation, depression) depths of 80 nm and 250 nm from the surface, were prepared for measurements.

As indicated in FIG. 11, the deeper the depth of the grooves of three dimensional structure 40, the less the adhesion force becomes. It was found that the average adhesive force was decreased by 80% when the depth of 250 nm was used.

In the above-described first or second embodiment, the water repellent layer 11a or three-dimensional structure 40 is provided on the surface of the optical element 11. However, if the optical element 11 is not provided between the focal plane shutter 50 and the solid image sensing unit 15, i.e., when the focal plane shutter 50 opposes the solid image sensing unit 15 (FIG. 10), dust that adheres to the surface of the solid image sensing unit 15 poses a problem.

Figure 10:
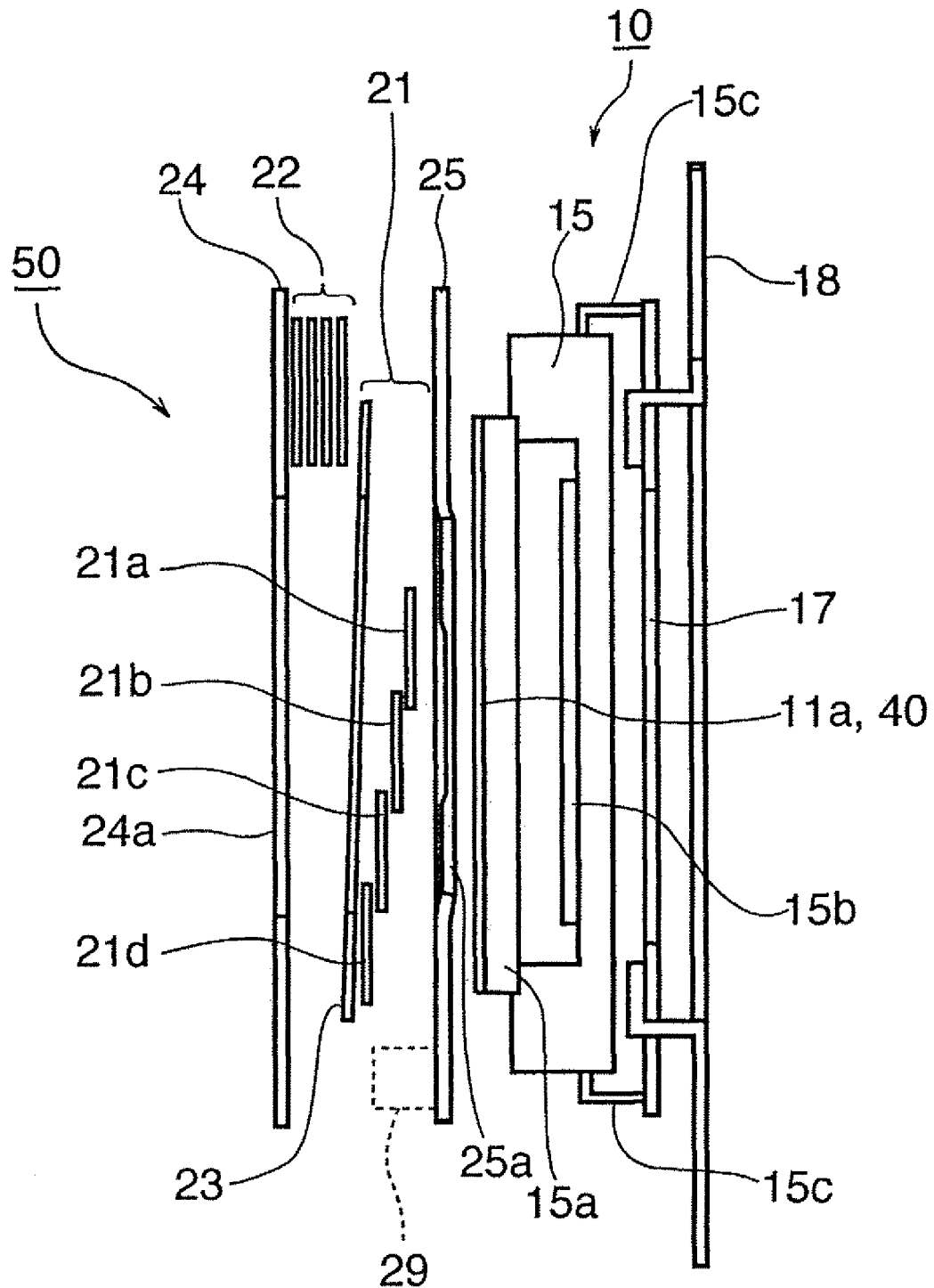
FIG. 10 depicts a side sectional view for explaining the schematic arrangement of the image capture unit and focal plane shutter of a D-SLR according to a modification to the embodiment of the present invention.

FIG. 10 depicts a side sectional view for explaining the schematic arrangement of the image capture unit 10 and focal plane shutter 50 of the D-SLR 100 according to a modification to the embodiment of the present invention. The same reference numerals as in FIGS. 1 and 6 described above denote the same parts in FIG. 10, and a description thereof will be omitted.

As is apparent from comparison between FIG. 10 and FIGS. 1 and 6 described above, the optical element 11, the holder 12 which holds the optical element 11, and the supporting plate 13 which integrates the optical element 11 and holder 12 while being in contact with the surface of the optical element 11 are omitted in FIG. 10. The focal plane shutter 50 directly opposes the solid image sensing unit 15.

Even in this arrangement, when the above-described water repellent layer 11a or three-dimensional structure 40 is provided on the surface of the cover 15a of the solid image sensing unit 15, the same effect as in the above-described embodiment can be obtained. Hence, even when the surface of the solid image sensing unit 15 is located immediately behind the focal plane shutter 50, dust can be suppressed from adhering to the surface of the glass or filter of the solid image sensing unit 15.

Third Embodiment

A camera system according to the third embodiment of the present invention will be described next with reference to FIGS. 12A to 14. In the third embodiment, the same reference numerals as in the above-described first and second embodiments denote the same components, and a description thereof will be omitted.

The third embodiment is different from the first and second embodiments in the surface of an optical element 11.

Figure 12B:
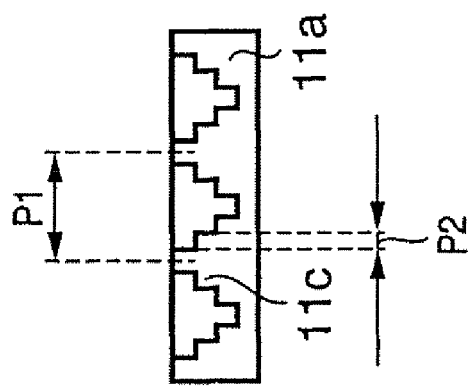
FIGS. 12A and 12B depict enlarged views of A in FIG. 1 according to the third embodiment of the present invention.
Figure 12A:
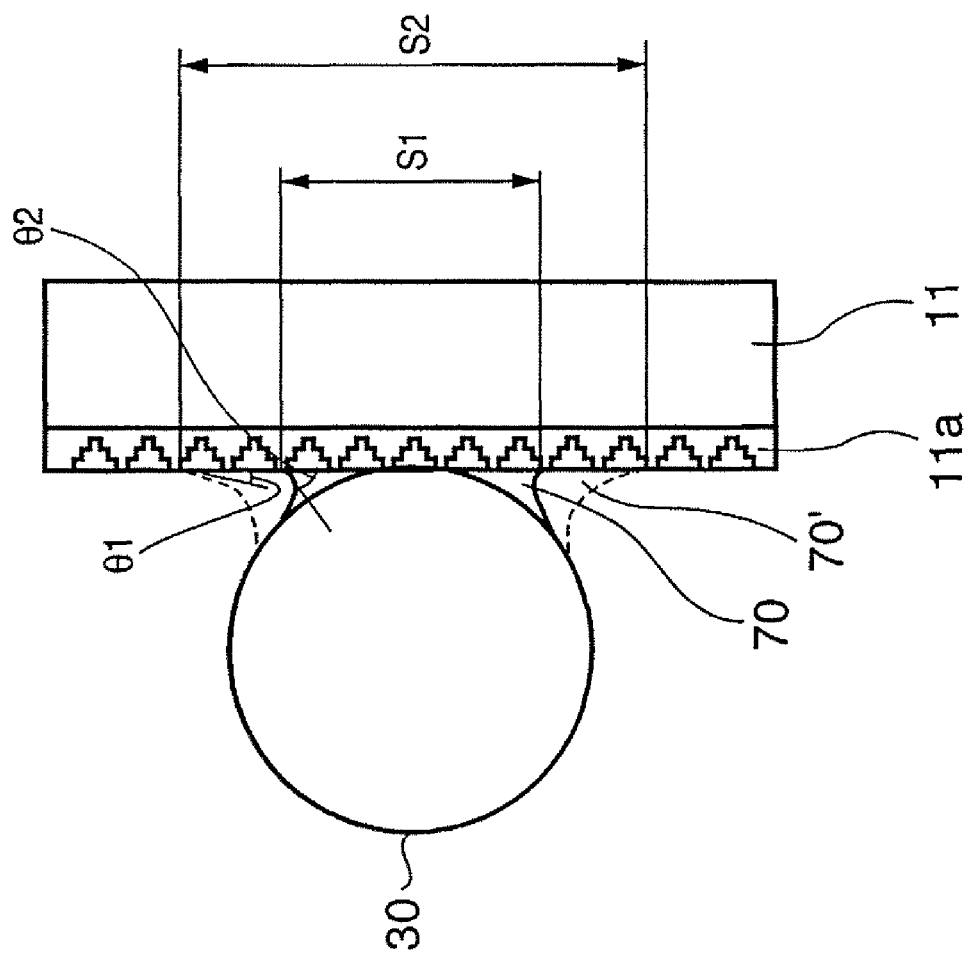

FIG. 12A shows a state wherein a dust adheres to the surface of the optical element 11. As shown in FIG. 12A, a three-dimensional structure 11a is provided on the opposite surface on the side of a focal plane shutter 50 (see FIG. 1) of the optical element 11. As shown in FIG. 12B, the three-dimensional structure 11a includes almost V-shaped concave portions having a pitch P1 and concave portions 11c having a pitch P2 and provided in the concave portions (this structure will be referred to as a fractal structure hereinafter). To prevent any optical adverse effect due to the three-dimensional structure 11a, the depth and pitch of the convex portions are made smaller than at least the wavelength range (380 to 770 nm) of visible light.

The three-dimensional structure 11a, i.e., fractal structure is formed by, e.g., a nanoimprint method in which a layer made of an acrylic or polycarbonate resin or fluoroplastic on the surface of the optical element 11 is pressed against a mold (stamper) with a fine shape on the nano order, thereby transferring the fine shape of the mold to the resin layer. Hence, the three-dimensional structure can be formed independently of the material of the optical element 11.

The fractal structure can also be formed by, e.g., a wet process to be described below in addition to the above-described dry process such as a nanoimprint method. A coating solution containing a conditioning solution made of a condensation polymer obtained from trialkoxysilane or oligomer thereof and a metal alkoxide or oligomer thereof is applied to a substrate, and the substrate is heat-treated to form a fractal structure in the surface layer.

As described in the first and second embodiments, a liquid crosslink is formed between the dust 30 and the surface of the optical element 11. A liquid crosslink formed when the three-dimensional structure 11a is provided on the surface of the optical element 11, as in this embodiment, is indicated as a liquid crosslink 70 (solid line in FIG. 12A). A liquid crosslink formed when no three-dimensional structure 11a is provided on the surface of the optical element 11 is indicated as a liquid crosslink 701 (broken line in FIG. 12A).

The crosslinking force of liquid for the same dust 30 will be examined. The surface tension (surface energy) of water does not change. Hence, a contact angle θ changes between the structure with the three-dimensional structure 11a on the surface of the optical element 11 and the structure without the three-dimensional structure 11a, as will be described later. The contact angle is represented by θ1 (without the three-dimensional structure 11a) or θ2 (with the three-dimensional structure 11a) (θ1<θ2; FIG. 12A).

The contact angle corresponds to the surface energy ratio of water to the three-dimensional structure 11a (or the surface of the optical element 11). Focus will be placed on a portion where the dust 30 contacts the three-dimensional structure 11a (FIG. 13).

As shown in FIG. 13, when the three-dimensional structure 11a is present, the dust 30 contacts at least one of single three-dimensional structures 11b included in the three-dimensional structure 11a. A liquid crosslink 70a is formed between the single three-dimensional structure 11b and the dust 30.

Actually, the dust 30 contacts the plurality of single three-dimensional structures 11b of the three-dimensional structure 11a, and a plurality of liquid crosslinks 70a are formed. The set of liquid crosslinks 70a can be regarded as the liquid crosslink 70 shown in FIG. 12A.

Independently of the magnitude relationship between the surface energy of the single three-dimensional structure 11b and that of the optical element 11 without the three-dimensional structure 11a, the contact area between the dust 30 and the three-dimensional structure 11a is smaller than that between the dust 30 and the surface of the optical element 11. Hence, the contact angle apparently changes depending on the presence/absence of the three-dimensional structure 11a. Since the contact angle θ is larger when the dust 30 contacts the three-dimensional structure 11a, θ1<θ2.

When the size of the liquid crosslink 70 formed between the dust 30 and the surface of the three-dimensional structure 11a is compared with that of the liquid crosslink 70' formed between the dust 30 and the surface of the optical element 11. The liquid crosslink 70 when the three-dimensional structure 11a is present (S1 in FIG. 12A) is smaller than the liquid crosslink 70' when the three-dimensional structure 11a is absent (S2 in FIG. 12A).

In equation (1) in the description of the first embodiment, only the contact angle θ changes depending on the presence/absence of the three-dimensional structure 11a. Hence, when the contact angle θ increases, an adhesive force $F_L$ decreases (0°≦θ≦90°). That is, an adhesive force $F_L1$ when the three-dimensional structure 11a is present and an adhesive force $F_L2$ when the three-dimensional structure 11a is absent have a relationship $F_L1<F_L2$.

That is, the adhesive force of the dust 30 to the three-dimensional structure 11a (optical element 11) is reduced by the three-dimensional structure 11a. If the three-dimensional structure 11a exists, the dust 30 which is going to adhere to the optical element 11 drops from its surface because of the small adhesive force and the influence of gravity applied to the dust 30. Hence, the dust 30 hardly adheres to the surface of the optical element 11.

As described in the second embodiment of the present invention, when the dust 30 adheres to the surface of the optical element 11 or the three-dimensional structure 11a, a van der Waals force serving as an interaction force acts between the dust 30 and the surface of the optical element 11.

Even in this embodiment, as in the second embodiment, a separation distance Z changes between the structure with the three-dimensional structure 11a on the surface of the optical element 11 and the structure without the three-dimensional structure 11a. An adhesive force $F_y1$ when the three-dimensional structure 11a is present and an adhesive force $F_y2$ when the three-dimensional structure 11a is absent have a relationship given by $$F_y1 < F_y2$$

If the three-dimensional structure 11a exists, the dust 30 which is going to adhere to the optical element 11 drops from its surface because of the small adhesive force of the dust 30 to the three-dimensional structure 11a (optical element 11) and the influence of gravity applied to the dust 30. Hence, the dust 30 hardly adheres to the surface of the optical element 11.

The effect of the three-dimensional structure 11a will be described here with reference to FIGS. 14A to 14D. FIGS. 14A to 14D depict images obtained by sensing the following situations, although schematic views are used for illustrative convenience.

Figure 14A:
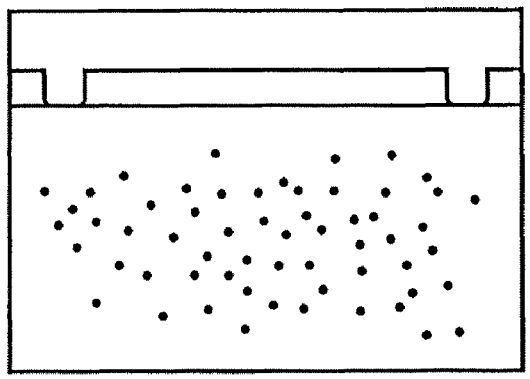
FIGS. 14A to 14D depict schematic views for explaining the effect of the three-dimensional structure 11a according to the third embodiment of the present invention.
Figure 14B:
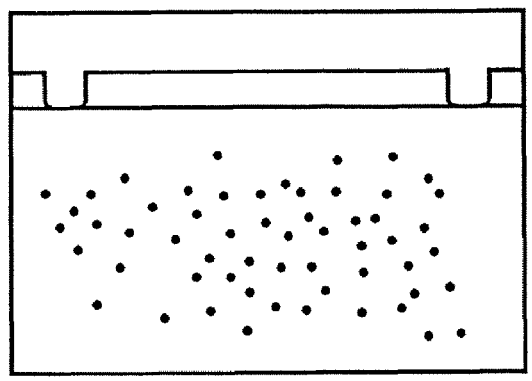
Figure 14C:
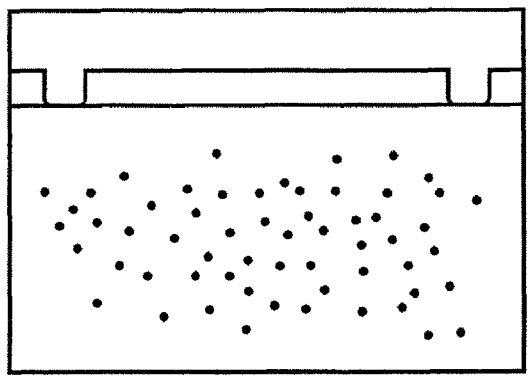
Figure 14D:
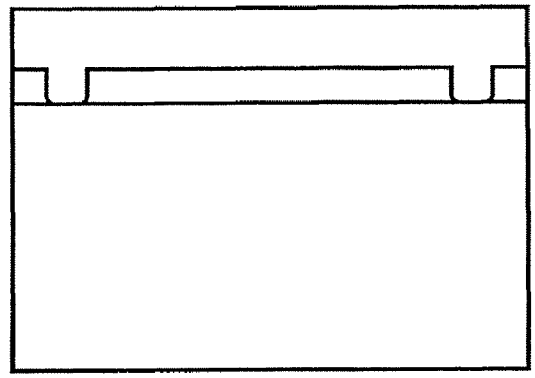

FIG. 14A shows a state wherein glass beads (perfect spheres) with an average grain size of 60 μm are sprayed to the surface of an Si substrate. FIG. 14B shows a state wherein the substrate is reversed from the state in FIG. 14A and returned to the state in FIG. 14A again. FIG. 14C shows a state wherein glass beads (perfect spheres) with an average grain size of 60 μm are sprayed to the surface of an Si substrate which has the periodical three-dimensional structure 11a formed by femtosecond laser irradiation. FIG. 14D shows a state wherein the substrate is reversed from the state in FIG. 14C and returned to the state in FIG. 14C again.

As is apparent from FIGS. 14A to 14D, in the Si substrate having no three-dimensional structure 11a on the substrate surface, the glass beads sprayed on its surface hardly drop even when the substrate is reversed. However, in the Si substrate having the three-dimensional structure 11a on the substrate surface, most sprayed glass beads have dropped from the substrate when the substrate is reversed.

That is, it can be confirmed that the adhesive force of the glass beads to the Si substrate surface is reduced by providing the three-dimensional structure 11a.

With the above-described structure, an optical device which suppresses dust from adhering to an optical element surface without any optical adverse effect can be implemented.

In the present invention, the three-dimensional structure 11a is directly provided on the surface of the optical element 11. However, the present invention is not limited to this.

For example, a dielectric multilayered film is often provided on the surface of the optical element 11 to cut infrared light while decreasing the surface reflection. In this case, when the three-dimensional structure 11a is provided on the uppermost surface of a dielectric multilayered film 60, the adhesive force of dust to the surface of the optical element 11 can be suppressed by the three-dimensional structure 11a while desired optical performance (e.g., spectral transmittance) is maintained by the dielectric multilayered film 60 located at the bottom of the three-dimensional structure 11a (FIGS. 12A and 12B). The dielectric multilayered film 60 is designed in consideration of the optical characteristic (e.g., refractive index) of the three-dimensional structure 11a, as a matter of course.

When the dielectric multilayered film 60 is provided on the three-dimensional structure 11a to obtain desired optical performance, the fine pattern formed by the three-dimensional structure 11a on the surface of the optical element 11 is filled with the dielectric multilayered film 60. To suppress adhesion of the dust 30, the three-dimensional structure 11a must be provided on the uppermost surface of the dielectric multilayered film 60, as described above.

Figure 15:
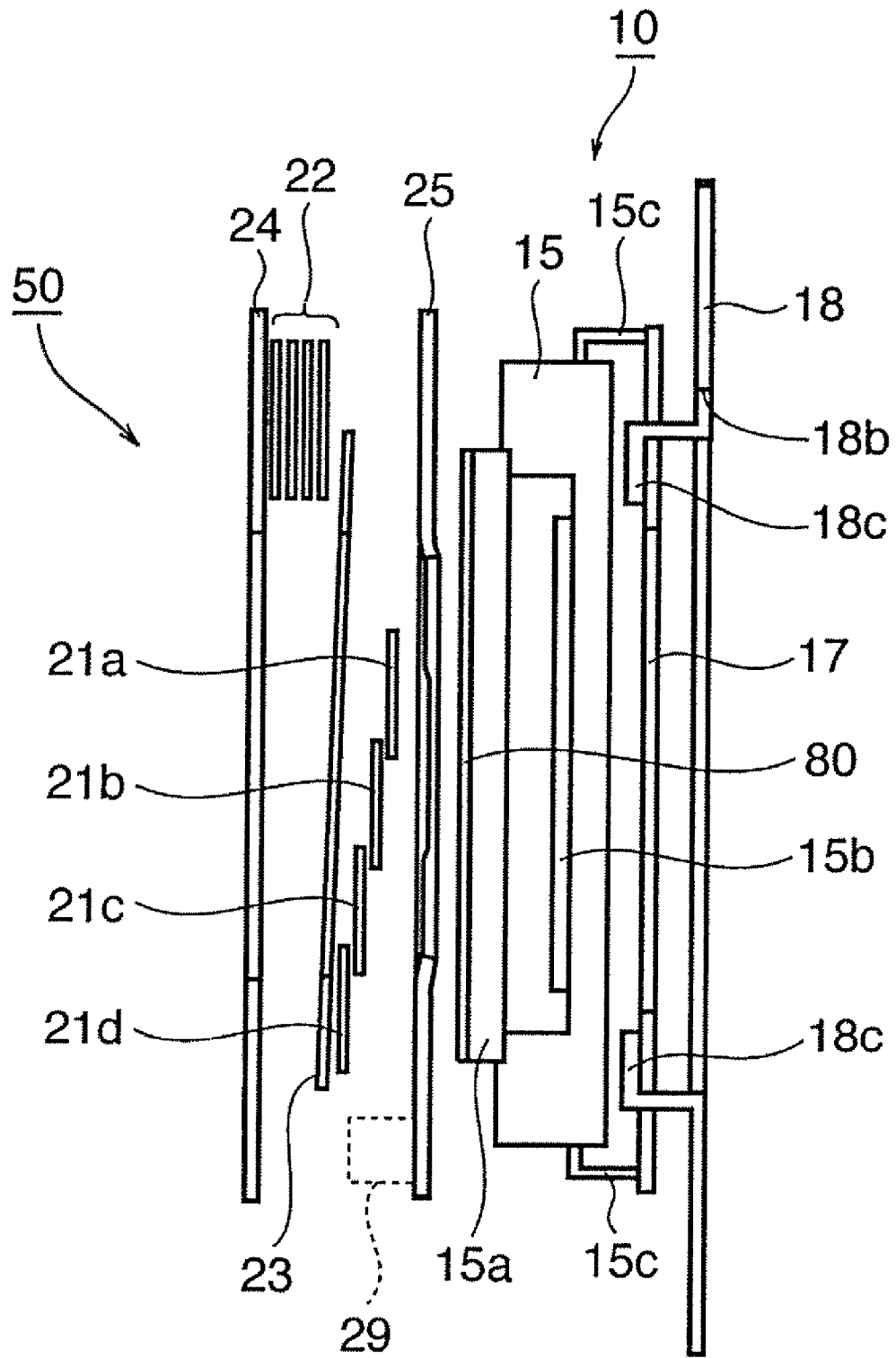
FIG. 15 depicts a side sectional view for explaining the schematic structure of an image sensing unit 10 and focal plane shutter 50 of a D-SLR 100 according to a modification of the present invention.

In the present invention, the three-dimensional structure 11a is provided on the surface of the optical element 11. If the optical element 11 is not provided between the focal plane shutter 50 and the solid image sensing unit 15, i.e., if the focal plane shutter 50 opposes the solid image sensing unit 15 (FIG. 15), dust adhering to the surface of the solid image sensing unit 15 poses a problem.

However, when a three-dimensional structure 80 is provided on the surface of the cover member 15a of the solid image sensing unit 15, the same effect as described in the present invention is obtained. Hence, dust can be prevented from adhering to the surface of the solid image sensing unit 15.

If a multilayered film such as an anti-reflection film is formed on the surface of the cover member 15a of the solid image sensing unit 15, the three-dimensional structure 80 described in one of the first to third embodiments is provided on the surface of the multilayered film, as described above. With this structure, the adhesive force of the dust 30 can be decreased while obtaining desired optical performance. Hence, dust can be prevented from adhering to the surface of the solid image sensing unit 15.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This patent application claims the benefit of Japanese Patent Application No. 2005-005539 filed on Jan. 12, 2005 and Japanese Patent Application No. 2005-359535 filed on Dec. 13, 2005, which are hereby incorporated by reference herein in their entirety.

What is claimed is:

1. An optical device having an image sensing unit for converting an optical image of an object into an electrical signal and an optical element which is arranged on a front surface of the image sensing unit, comprising:
   a first three-dimensional structure having a first period, to be provided on an object-side surface of the optical element; and
   a second three-dimensional structure having a second period smaller than the first period, to be provided on a surface of the first three-dimensional structure.

2. An optical device having an image sensing unit for converting an optical image of an object into an electrical signal, comprising:
   a first three-dimensional structure having a first period, to be provided on an object-side surface of the image sensing unit; and
   a second three-dimensional structure having a second period smaller than the first period, to be provided on a surface of the first three-dimensional structure.

* * * * *